United States Patent
Chen (10) Patent No.: US 11,313,918 B2
(45) Date of Patent: Apr. 26, 2022

(54) METHODS AND SYSTEMS FOR INDICATING AND DETECTING ALIGNMENT BETWEEN COUPLED COMPONENTS

(71) Applicant: The Boeing Company, Chicago, IL (US)

(72) Inventor: Cameron Kai Ming Chen, Chicago, IL (US)

(73) Assignee: The Boeing Company, Chicago, IL (US)

( * ) Notice: Subject to any disclaimer, the term of this patent is extended or adjusted under 35 U.S.C. 154(b) by 183 days.

(21) Appl. No.: 16/750,758

(22) Filed: Jan. 23, 2020

(65) Prior Publication Data
US 2021/0231750 A1  Jul. 29, 2021

(51) Int. Cl.
| | | |
|---|---|---|
| *G01R 31/69* | (2020.01) | |
| *G06K 19/07* | (2006.01) | |
| *G06K 7/10* | (2006.01) | |
| *G08B 5/22* | (2006.01) | |

(52) U.S. Cl.
CPC ......... *G01R 31/69* (2020.01); *G06K 7/10366* (2013.01); *G06K 19/0723* (2013.01); *G08B 5/22* (2013.01)

(58) Field of Classification Search
CPC .............. G01R 31/69; G06K 19/0723; G06K 7/10366; G08B 5/22
See application file for complete search history.

(56) References Cited

U.S. PATENT DOCUMENTS

| | | | | |
|---|---|---|---|---|
| 6,304,177 B1* | 10/2001 | Nigro, Jr. | ................ | E05B 45/12 200/61.67 |
| 2005/0283936 A1* | 12/2005 | Barker | .................... | A47L 11/34 15/320 |
| 2009/0224529 A1* | 9/2009 | Gill | ..................... | A61M 39/105 285/23 |
| 2018/0266602 A1* | 9/2018 | Fremont | ................. | F16L 35/00 |
| 2018/0304770 A1* | 10/2018 | Nishizaki | ............... | B60N 2/002 |

\* cited by examiner

*Primary Examiner* — Omer S Khan
(74) *Attorney, Agent, or Firm* — McDonnell Boehnen Hulbert & Berghoff LLP (57) ABSTRACT

In an example, a system for indicating alignment between two components that are mechanically coupled to each other is disclosed. The system includes a first component, a second component, a connector configured to mechanically couple the first component to the second component by moving the connector from a first position to a second position, a first circuit affixed to the first component, and a second circuit affixed to the connector. The first circuit and the second circuit are positioned on the first component and the connector, respectively, such that an electrical connection between the first circuit and the second circuit occurs when the connector is in the second position and the first component and the second component are aligned. The first circuit or the second circuit comprises an antenna, and the electrical connection enables the antenna to transmit a signal.

20 Claims, 8 Drawing Sheets

FIG. 14

METHODS AND SYSTEMS FOR INDICATING AND DETECTING ALIGNMENT BETWEEN COUPLED COMPONENTS

FIELD

The present disclosure relates generally to facilitating alignment of components within electrical systems or other systems, and more particularly, to indicating and detecting alignment between mechanical or electromechanical components that are mechanically coupled together.

BACKGROUND

Electrical systems, such as those included in aircraft or other vehicles, include many interconnected electrical components such as line replaceable units, or other modular or non-modular components. Typically, any given pair of electrical components are not hardwired together, but rather connected via physical components such as electrical connectors—that is, electromechanical devices that are mechanically coupled together to join electrical terminations. For example, one electrical wire extending from a first line replaceable unit might be coupled to a male connector designed to snap into a female connector that is coupled to another electrical wire extending from a second line replaceable unit, thereby enabling the two line replaceable units to be electrically connected. In some existing implementations, an additional mechanical connector might be used to join the two electrical connectors and/or keep the electrical connectors joined.

However, in some scenarios, the two electrical connectors might not be properly aligned. This can occur in various ways, such as due to the electrical connectors not being pushed all the way together such that one electrical connector locks to the other (for instance, in practice, the electrical connectors can at times be difficult to close by hand). As a result, an electrical connection between two line replaceable units or other electrical components of the electrical system might not be established or might not operate as desired.

Some existing solutions for addressing this issue have an additional mechanical connector that is designed to facilitate alignment of the two electrical connectors. However, in some scenarios, the mechanical connector might break, might not properly align the electrical connectors, or might not be moved to the correct position that brings the electrical connectors into alignment. Additionally or alternatively, existing solutions implement visual indications of alignment, such as stripes or other markings painted on the electrical connectors so that an individual inspecting the electrical connectors can conclude that the electrical connectors are properly aligned by observing whether the respective markings on the two electrical connectors are aligned. However, there are situations where the electrical connectors, and thus the markings, are in locations where obstacles partially or fully obstruct an individual's line of sight. As a result, the individual performing the inspection might not be able to accurately determine whether electrical connectors are properly aligned.

What is needed is a mechanism to more accurately determine proper alignment between mechanically coupled components in electrical systems, particularly in scenarios where line of sight is obstructed.

SUMMARY

In an example, a system for indicating alignment between two components that are mechanically coupled to each other. The system includes a first component and a second component. The system also includes a connector configured to mechanically couple the first component to the second component by moving the connector from a first position to a second position. The system also includes a first circuit affixed to the first component and a second circuit affixed to the connector. The first circuit and the second circuit are positioned on the first component and the connector, respectively, such that an electrical connection between the first circuit and the second circuit occurs when the connector is in the second position and the first component and the second component are aligned. The first circuit or the second circuit comprises an antenna, and the electrical connection enables the antenna to transmit a signal.

In another example, a method for detecting alignment between a first component and a second component that are mechanically coupled to each other is described. The first component and the second component are mechanically coupled to each other by moving a connector from a first position to a second position. A first circuit is affixed to the first component, a second circuit is affixed to the connector, and the first circuit and the second circuit are positioned on the first component and the connector, respectively, such that an electrical connection between the first circuit and the second circuit occurs when the connector is in the second position and the first component and the second component are aligned. The first circuit or the second circuit comprises an antenna. The method involves controlling, by a processor, a sensor to transmit a first signal, wherein receipt of the first signal by the antenna causes the antenna to transmit a response signal detectable by the sensor, where the electrical connection enables the antenna to transmit the response signal, and wherein the processor is coupled to the sensor. The method also involves determining, by the processor, that the sensor has received the response signal.

In another example, a non-transitory computer readable medium having stored thereon instructions, that when executed by one or more processors of a computing device, cause the computing device to perform operations is described. The operations include controlling a sensor to transmit a first signal, where receipt of the first signal by an antenna causes the antenna to transmit a response signal detectable by the sensor, where an electrical connection between a first circuit affixed to a first component and a second circuit affixed to a connector enables the antenna to transmit the response signal, where the connector, when moved from a first position to a second position, mechanically couples the first component to a second component, where the first circuit and the second circuit are positioned on the first component and the connector, respectively, such that the electrical connection between the first circuit and the second circuit occurs when the connector is in the second position and the first component and the second component are aligned. The operations also include determining that the sensor has received the response signal.

The features, functions, and advantages that have been discussed can be achieved independently in various examples or may be combined in yet other examples. Further details of the examples can be seen with reference to the following description and drawings.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying drawings, wherein:

DETAILED DESCRIPTION

Disclosed examples will now be described more fully hereinafter with reference to the accompanying drawings, in which some, but not all of the disclosed examples are shown. Indeed, several different examples may be described and should not be construed as limited to the examples set forth herein. Rather, these examples are described so that this disclosure will be thorough and complete and will fully convey the scope of the disclosure to those skilled in the art.

By the terms "substantially," "about," "approximately," and "proximate" used herein, it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Unless otherwise specifically noted, elements depicted in the drawings are not necessarily drawn to scale.

Within examples, described herein are methods and systems for indicating and detecting alignment between two components that are mechanically coupled together. The disclosed methods and systems can be used in various contexts, such as in the electrical or non-electrical systems of aircrafts or other vehicles, or in systems and environments other than vehicles.

Unless otherwise specifically noted, "alignment" of two components (e.g., electrical connectors, etc.) that are mechanically coupled together refers to the two components being in the correct (or "proper") relative positions with respect to each other, so that the mechanical coupling of the two components serves its intended purpose (e.g., electrically connecting two modular line replaceable units in an aircraft's electrical system). What constitutes correct relative positions can vary depending on the context in which the two components are being used. For example, if the components are electrical connectors configured to be mated by pushing the connectors together, alignment of the electrical connectors can involve the electrical connectors being pushed together such that they cannot be pushed any farther and a mating surface of one electrical connector is in direct contact with a mating surface of the other electrical connector. As another example, alignment of the electrical connectors can be achieved when the device that is helping mechanically-couple the electrical connectors together has "bottomed out" or otherwise reached a state where it cannot move farther, in which case the device might be directly contacting one of the electrical connectors or might be separated from one of the electrical connectors by a gap (e.g., a 0.25 to 0.75 millimeter gap). As an example, the device that is mechanically-coupling the electrical connectors together might snap into, or pass a rounded protuberance to, a final position in which the electrical connectors are considered to be in alignment, whereas the electrical connectors might not be in alignment if the device does not snap into or pass the rounded protuberance to reach such a final position. Additionally, depending on the type of electrical connector being used, alignment of the electrical connectors can involve a top surface of one connector being approximately flush with a top surface of the other connector. Other examples are possible as well.

The disclosed systems include two components (e.g., electrical connectors) that are mechanically coupled together using a connector (e.g., a cam lever) by moving the connector from a first position to a second position. A first circuit is affixed to a body of a first of the two components and a second circuit is affixed to the connector. The two circuits are positioned such that, when the connector reaches the second position, an electrical connection between the two circuits will occur if the first and second components are aligned. The first circuit or second circuit includes an antenna and, when the electrical connection occurs, the electrical connection enables the antenna to transmit a signal. The signal is a non-visual indication that the two components are aligned. A sensor then receives the signal, thus indicating that the two components are aligned. In other words, movement of the connector to the second position completes a single circuit made up of the first and second circuits and having an antenna, and enables the sensor to detect signals from the single circuit.

For example, the two circuits can be two portions of a radio frequency identification (RFID) tag, each having a respective induction coil, and one of which having an antenna. When the connector is moved to the second position, the two tag portions are inductively coupled, thus completing the RFID tag and powering the antenna. The sensor (e.g., an RFID reader) can thereafter transmit a signal to the RFID tag and, due to the RFID tag being completed, the RFID tag's antenna can transmit a response signal to the RFID reader, which the RFID reader or associated computing device can interpret as an indication that the two components are aligned. If the two components were not aligned, the RFID tag circuit would not be complete, the antenna would not be powered, and thus, the antenna would not be able to receive a signal from the RFID reader or transmit a response signal.

The disclosed methods and systems thus advantageously provide a non-visual indication of alignment between mechanically-coupled components, which can be particularly helpful when coupled components are in areas that cannot easily be inspected with line of sight. This in turn can help inspectors efficiently identify and remedy components that are not aligned.

These and other improvements are described in more detail below. Implementations described below are for purposes of example. The implementations described below, as well as other implementations, may provide other improvements as well.

Figure 1:
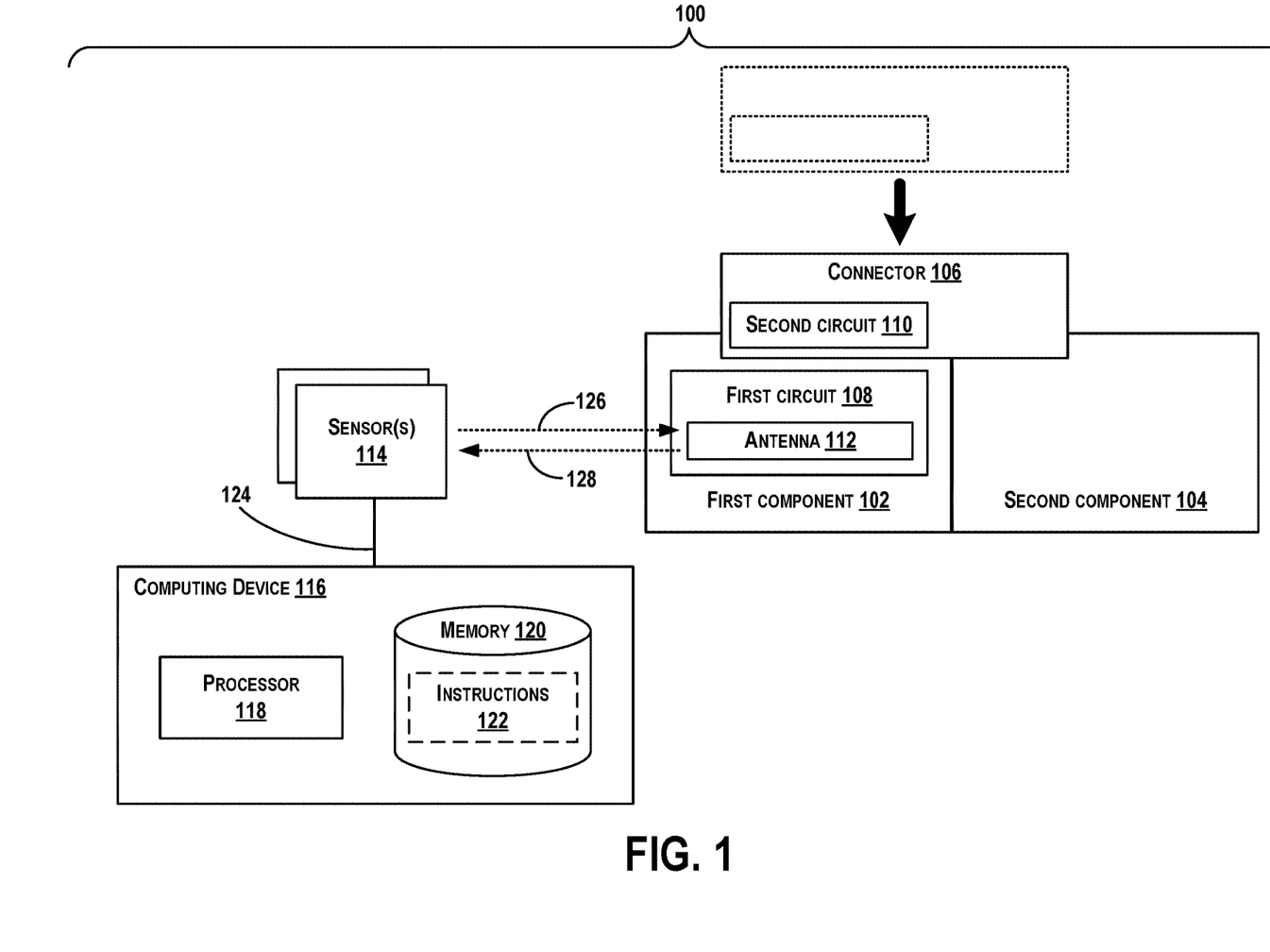
FIG. 1 depicts a system for indicating alignment between two components that are mechanically coupled to each other, according to an example implementation.

Referring now to the figures, FIG. 1 is a simplified block diagram of an example of a system 100 for indicating alignment between two components, a first component 102 and a second component 104, that are mechanically coupled to each other. In addition to the first component 102 and the second component 104, the system 100 includes a connector 106, a first circuit 108 affixed to the first component 102, and a second circuit 110 affixed to the connector 106. The first circuit 108 includes an antenna 112, although in alternative embodiments, the second circuit 110 can include the antenna 112.

The system 100 is also shown to include one or more sensors 114 and a computing device 116. The computing device 116 includes a processor 118 and a memory 120, where the memory 120 has stored instructions 122. Further, the computing device 116 is shown to be coupled to the one or more sensors 114 via a communication link 124.

The first component 102 can take the form of an electromechanical or mechanical device, such as a plug, configured to connect to another electromechanical or mechanical device. As an example, and as noted above, the first component 102 can take the form of an electrical connector that is used to electronically couple one electrical system to another electrical system. The first component 102 can include pins, flanges, springs, other projecting members, recesses, locking mechanisms (e.g., snap-lock mechanisms), and/or other features, such as male and/or female features, that facilitate mechanical coupling of the first component 102 to the second component 104. In some embodiments, the first component 102 can be keyed in some embodiments to facilitate correct orientation of the first component 102 when coupled to the second component 104. Other examples are possible as well.

The second component 104, similar to the first component 102, can take the form of an electromechanical or mechanical device configured to connect to another electromechanical or mechanical device. As an example, and as noted above, the second component 104 can take the form of an electrical connector, such as an electrical connector that is used to electronically couple one electrical system to another electrical system. The second component 104 can include pins, flanges, springs, other projecting members, recesses, locking mechanisms (e.g., snap-lock mechanisms), and/or other features, such as male and/or female features, that facilitate mechanical coupling of the second component 104 to the first component 102. In some embodiments, the second component 104 can be keyed in some embodiments to facilitate correct orientation of the second component 104 when coupled to the first component 102. Other examples are possible as well.

The first component 102 and the second component 104, depending on their respective configurations, can be joined together in various ways, such as by pushing or twisting.

The connector 106 can take the form of a mechanical device that is configured to mechanically couple the first component 102 to the second component 104 by moving the connector 106 from a first position to a second position. In this context, the act of the connector 106 mechanically coupling the first component 102 to the second component 104 can take different forms. For example, the connector 106 can be used as a mechanism to move the first component 102 and/or the second component 104 from an unattached position (e.g., separated by a gap) to a position where the first component 102 and the second component 104 are attached (e.g., the respective male and female features joined, and perhaps snap-locked together). Additionally or alternatively, the connector 106 can be used to hold the first component 102 and the second component 104, thereby functioning as a failsafe to ensure the first component 102 and the second component 104 remain attached. Additionally or alternatively, the connector 106 can be used as a mechanism that promotes alignment between the first component 102 and the second component 104. Other examples are possible as well.

Furthermore, in some embodiments, the connector 106 can be a distinct component that is separate from the first component 102 and the second component 104. For example, the connector 106 can be a cam lever that is fastened (e.g., with screws, bolts, etc.) to either the first component 102 or the second component 104. In alternative embodiments, the connector 106 can be integral with the first component 102 and/or the second component 104.

In FIG. 1, the block representing the connector 106 is illustrated with solid lines and overlays a portion of the blocks representing the first component 102 and the second component 104, which represents the connector 106 at a second position where the connector 106 is mechanically coupling the first component 102 to the second component 104. In some embodiments, the connector 106 can be configured to lock into the second position once the connector 106 is moved to the second position.

As further shown in FIG. 1, the block having dotted lines, located above the block representing the connector 106, represents the connector 106 when it is in a first position where the connector 106 is not mechanically coupling the first component 102 to the second component 104.

The first circuit 108 can take the form of an integrated circuit that includes multiple interconnected components, such as two or more of the following components: a power source, current source, resistor, capacitor, a controller, a rectifier circuit, a transponder, a memory, an induction coil, the antenna 112, or an additional circuit. In some embodiments, the first circuit 108 can include in part, or take the form of, a conductive sheet, such as a thin sheet made of copper, aluminum, or other conductive material. The first circuit 108 can be affixed to the first component 102 in various ways, such as using a fastener or adhesive to affix the first circuit 108 to a surface of the first component 102. As a specific example, the first circuit 108 can be a sticker having a portion of an RFID tag that includes an induction coil and the antenna 112. The sticker can be adhered onto a surface of the first component 102. Other examples are possible as well.

The second circuit 110 can take the form of an integrated circuit that includes multiple interconnected components, such as two or more of the following components: a power source, current source, resistor, capacitor, a controller, a rectifier circuit, a transponder, a memory, an induction coil, the antenna 112, or an additional circuit. In some embodiments, the second circuit 110 can include in part, or take the form of, a conductive sheet, such as a thin sheet made of copper, aluminum, or other conductive material. The second circuit 110 can be affixed to the connector 106 in various ways, such as using a fastener or adhesive to affix the second circuit 110 to a surface of the connector 106. As a specific example, the second circuit 110 can be a sticker having a portion of an RFID tag that includes a memory, controller, rectifier circuit, transponder, and induction coil. The sticker can be adhered onto a surface of the connector 106. Other examples are possible as well.

The dimensions and shape of the first circuit 108 and the second circuit 110 can be selected based on the dimensions and shape of the first component 102, the second component 104, and the connector 106. For example, when the first component 102, the second component 104, and the connector 106 are small, the first circuit 108 and the second circuit 110 can have a small form factor (e.g., 15-35 millimeters in width and length). The system 100 is thus useful in small form factor scenarios As noted above, in some embodiments, the first circuit 108 can include the antenna 112, but in other embodiments, the second circuit can include the antenna 112. In some embodiments, one or both circuits can include a filter (e.g., a band pass filter) to ground out any induced power signal on any wiring in the circuit(s) that is/are used to transfer data. It can be desirable in some examples to induce power only into the portion of the circuit(s) that can carry the induced power.

The one or more sensors 114 can include at least one sensor that is configured to receive a signal (e.g., a radio frequency signal) from the antenna 112. The one or more sensors 114 can also include at least one sensor (e.g., the same sensor(s) that receive the signal or other sensor(s)) that is configured to transmit a signal that is receivable by the antenna 112. In some embodiments, such a sensor or sensors can take the form of one or more RFID reader(s). Further, in some embodiments, the one or more sensors 114 can include at least one camera, such as any type of camera configured to acquire images of an environment. Any one or more of the one or more sensors 114 can be operated by a human (e.g., a handheld or other portable RFID reader or camera), can be mounted to a robotic device (e.g., a mobile robot with wheels), and/or can be fixed at different locations in the environment of the system 100. Other examples are possible as well. In some embodiments, a particular sensor of the one or more sensors 114 might include its own processor or chip, which can perform at least some of the operations described herein as being performed by the computing device 116 or the processor 118.

The computing device 116 can take the form of a client device (e.g., a computing device that is actively operated by a user), a server, cloud computing device, or some other type of computational platform. In some examples, the computing device 116 can take the form of a desktop computer, laptop computer, tablet computer, smartphone, wearable computing device (e.g., AR glasses), or other type of device. The computing device 116 can be in communication with the one or more sensors 114. As such, the computing device 116 can receive information from the one or more sensors 114 and/or transmit information to the one or more sensors 114. For example, the computing device 116 can transmit a control instruction to the one or more sensors 114 to cause the one or more sensors 114 to transmit a first signal 126, such as a radio frequency signal, which is then received by the antenna 112. Further, when the one or more sensors 114 receive a response signal 128 from the antenna 112, the one or more sensors 114 can transmit the response signal, or other data that indicates alignment of the first component 102 and the second component 104, to the computing device 116, which the computing device 116 might store in the memory 120.

The processor 118 can be a general-purpose processor or special purpose processor (e.g., a digital signal processor, application specific integrated circuit, etc.). The processor 118 is configured to execute the instructions 122 (e.g., computer-readable program instructions including computer executable code) that are stored in the memory 120 and are executable to provide various operations described herein. In alternative examples, the computing device 116 can include additional processors that are configured in the same manner. At least some of the operations described herein as being performed by the computing device 116 can be performed by the processor 118. The computing device 116, and thus the processor 118, can be coupled to the one or more sensors 114 by way of the communication link 124.

The memory 120 can take the form of one or more computer-readable storage media that can be read or accessed by the processor 118. The computer-readable storage media can include volatile and/or non-volatile storage components, such as optical, magnetic, organic or other memory or disc storage, which can be integrated in whole or in part with the processor 118. The memory 120 is considered non-transitory computer readable media. In some examples, the memory 120 can be implemented using a single physical device (e.g., one optical, magnetic, organic or other memory or disc storage unit), while in other examples, the memory 120 can be implemented using two or more physical devices.

The communication link 124 can take the form of any wired connection (e.g., Ethernet) or wireless connection (e.g., Bluetooth®) over which at least one of the one or more sensors 114 and the computing device 116 can engage in communication (e.g., data communication).

In operation, the connector 106 can be moved from the first position to the second position, thereby mechanically coupling the first component 102 to the second component 104. Further, when the connector 106 is in the second position and the first component 102 and the second component 104 are aligned, an electrical connection between the first circuit 108 and the second circuit 110 occurs. The term "combined circuit" will be used hereinafter to refer collectively to the first circuit 108 and the second circuit 110 that are electrically connected to each other.

To facilitate this, the first circuit 108 and the second circuit 110 are positioned on the first component 102 and the connector 106, respectively, such that the electrical connection between the first circuit 108 and the second circuit 110 occurs when the connector 106 is in the second position and the first component 102 and the second component 104 are aligned. For example, the first circuit 108 and the second circuit 110 can be affixed to respective locations on the first component 102 and the connector 106 so that, when the connector 106 is in the second position, the electrical connection will occur due to at least a portion of the first circuit 108 and at least a portion of the second circuit 110 either coming into direct contact with each other or being within a threshold distance from each other (e.g., 0.25 to 0.75 millimeter gap between the first circuit 108 and the second circuit 110). In some examples, the electrical connection can occur when the first circuit 108 and the second circuit 110 are substantially laterally aligned (e.g., the borders of each circuit are in perfect lateral alignment, assuming the circuits have the same border dimensions). In other examples, however, the electrical connection can occur when the first circuit 108 and the second circuit 110 are not in perfect lateral alignment (e.g., within 1.5 millimeters of perfect lateral alignment), which can allow for variation in where the first circuit 108 and the second circuit 110 are affixed to the first component 102 and the connector 106, respectively.

As a more specific example, the first circuit 108 can be affixed to a top surface of the first component 102 and the second circuit 110 can be affixed to a bottom surface of the connector 106 (e.g., an underside of a cam lever) so that, when the connector 106 is moved to the second position (e.g., the cam lever is moved to a closed/locked position and the underside of the cam lever is brought closer to the top surface of the first component 102), the first circuit 108 and the second circuit 110 are brought into direct contact or within a threshold distance of each other. Other examples are possible as well.

In some embodiments, the electrical connection might not occur unless the first circuit 108 and the second circuit 110 are positioned such that, in the second position of the connector 106, a specific portion or more of the first circuit 108 (e.g., a first induction coil) and a corresponding specific portion or more of the second circuit 110 (e.g., a second induction coil) are in direct contact or within a threshold distance from each other.

The occurrence of the electrical connection powers the antenna 112, thereby enabling the combined circuit to transmit a signal to the one or more sensors 114. However, if the connector 106 is not fully moved all the way to the second positon, the first component 102 and the second component 104 might not be aligned and the electrical connection might not occur (e.g., the gap between the first circuit 108 and the second circuit 110 might be too large for inductive coupling to occur). With no electrical connection, the antenna 112 is not powered and the antenna 112 cannot transmit or receive signals. Thus, the system 100 can advantageously help indicate that the connector 106 is in its proper position and that the first component 102 and second component 104 are aligned.

Upon establishment of the electrical connection, the combined circuit can be configured to automatically (e.g., without being instructed to do so and without being programmed to do so in response to receiving a signal) transmit a signal via the antenna 112, such as at predefined intervals (e.g., every minute). The signal can be received by the one or more sensors 114.

Additionally or alternatively, the combined circuit can be configured to transmit the response signal 128 in response to receiving the first signal 126. To facilitate this, the computing device 116 can transmit an instruction to, or otherwise control, the one or more sensors 114 to transmit the first signal 126, which the antenna 112 can then receive. The combined circuit can be configured such that, in response to receiving the first signal 126, the antenna 112 will transmit the response signal 128 which the one or more sensors 114 can then receive. If the connector 106 is not in the second position and there is no alignment between the first component 102 and the second component 104, however, the one or more sensors 114, and thus the computing device 116, will not receive a response signal.

In some embodiments, computing device 116 can determine that the one or more sensors 114 have received the response signal 128. For example, the one or more sensors 114 can transmit, to the computing device 116, the response signal 128 itself and/or other data indicating that the one or more sensors 114 received the response signal 128. The computing device 116 can be configured to interpret receipt of the response signal 128 or such other data as an indication that the first component 102 and the second component 104 are aligned. As such, in response to determining that the one or more sensors 114 has/have received the response signal 128, the computing device 116 can store in the memory 120 an indication that the first component 102 and the second component 104 are in alignment. Similarly, the computing device 116 can be configured to make a determination that no response signal has been received by the one or more sensors 114 within a threshold period of time since the first signal 126 was transmitted and, in response to making the determination, store in the memory 120 an indication that the first component 102 and the second component 104 are not in alignment.

In some embodiments, the combined circuit can be a passive circuit having no power source, although in alternative embodiments, the combined circuit might include a power source.

Additional examples will now be described with respect to FIGS. 2, 3, 4, 5, and 6.

Figure 2:
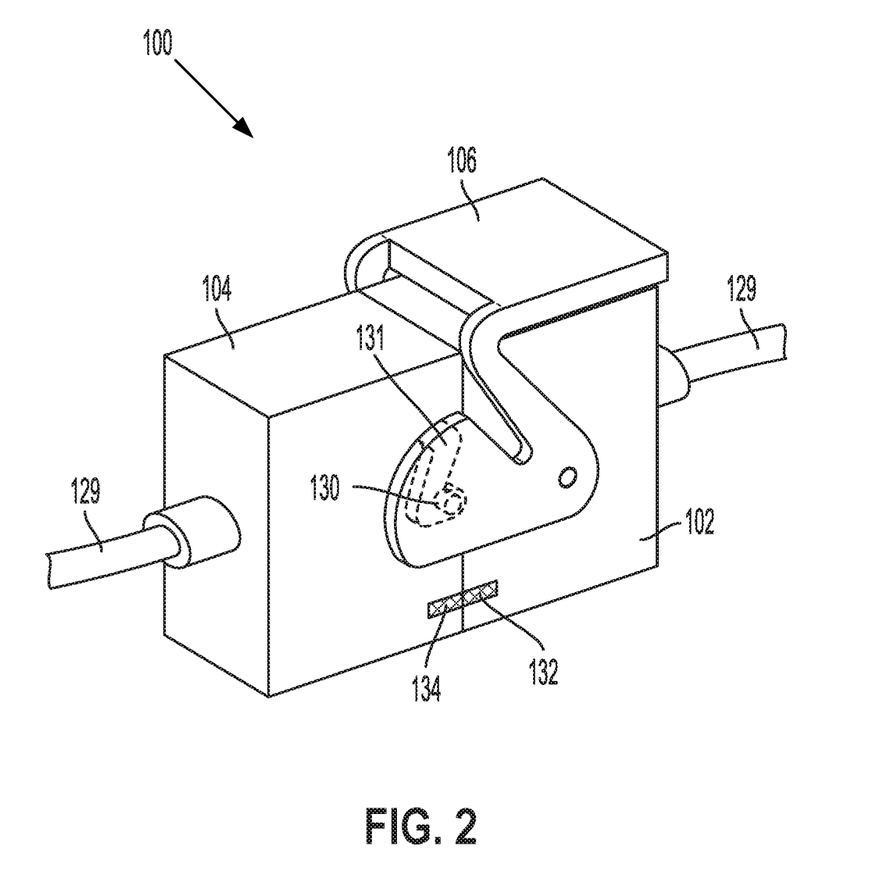
FIG. 2 depicts a perspective view of an example embodiment of the system of FIG. 1, according to an example implementation.

FIG. 2 depicts a perspective view of an example embodiment of the system 100. In particular, FIG. 2 shows the first component 102 and the second component 104 in the form of electrical connectors to which electrical cables 129 are attached. Thus, by mechanically coupling the electrical connectors, two electrical systems can be electrically coupled via the electrical cables 129, the first component 102, and the second component 104. As further shown, the connector 106 is in the form of a cam lever that is rotatably attached to the first component 102.

In the embodiment shown in FIG. 2, the act of mechanically coupling the first component 102 to the second component 104 involves mechanically coupling the first component 102 to the second component 104 by moving the cam lever from the first position to the second position. FIG. 2 illustrates the connector 106 in the second position where the cam lever is in a closed/locked position, such that the second circuit 110 is proximate to or contacting the first circuit 108. To bring the cam lever into the closed/locked position, a pin 130 protruding perpendicularly from a side surface of the second component 104 is brought into an opening of a groove 131 cut out in the connector 106. The groove 131 is depicted with dotted lines in both FIG. 2 and FIG. 3. When the cam lever is closed, the pin 130 moves through the groove 131 to a back end of the groove 131. The pin 130 is shown in FIG. 2 at the back end of the groove.

The first and second circuits are not explicitly shown in FIG. 2, due to the second circuit 110 being located on an underside of the cam lever and the first circuit 108 being located on a top surface of the first component 102, thus being obstructed from view by the cam lever. With the arrangement in FIG. 2, the system 100 can verify that the cam lever is all the way down and closed without having to visually inspect it.

In some embodiments, the system 100 can advantageously include other elements that help supplement the indication of alignment provided by the signal/response signal from the combined circuit. For example, FIG. 2 also shows that the first component 102 has a first marking 132 and the second component 104 has a second marking 134. Each marking is configured to visually indicate alignment between the first component 102 and the second component 104. Thus, in operation, when the connector 106 (e.g., the cam lever) is in the second position and the first component 102 and the second component 104 are aligned, the first marking 132 and the second marking 134 are aligned. Such markings can be useful in scenarios where the first component 102 and the second component 104 are in a location where they are at least partially visible during inspection.

In some embodiments, the first marking 132 and the second marking 134 can be observed using a sensor, additionally or alternatively to being observed in person by an inspector. For example, the one or more sensors 114 of FIG. 1 might include, in addition to a first sensor such as an RFID reader, a second sensor such as a camera. As such, the computing device 116 of FIG. 1 can control the second sensor to capture image data representing the first component 102 and the second component 104 after the connector 106 (e.g., the cam lever) has been moved to the second position. Based on the image data, such as by performing an analysis of features in one or more images, the computing device 116 can determine that the first marking 132 and the second marking 134 are aligned and responsively store in the memory 120 of FIG. 1 an indication that the first component 102 and the second component 104 are in alignment. The computing device 116 can be configured to store such an indication in response to determining that the one or more sensors 114 have received the response signal 128 of FIG. 1 (or other signal from the antenna 112) and/or in response to determining that the first marking 132 and the second marking 134 are aligned.

Figure 3:
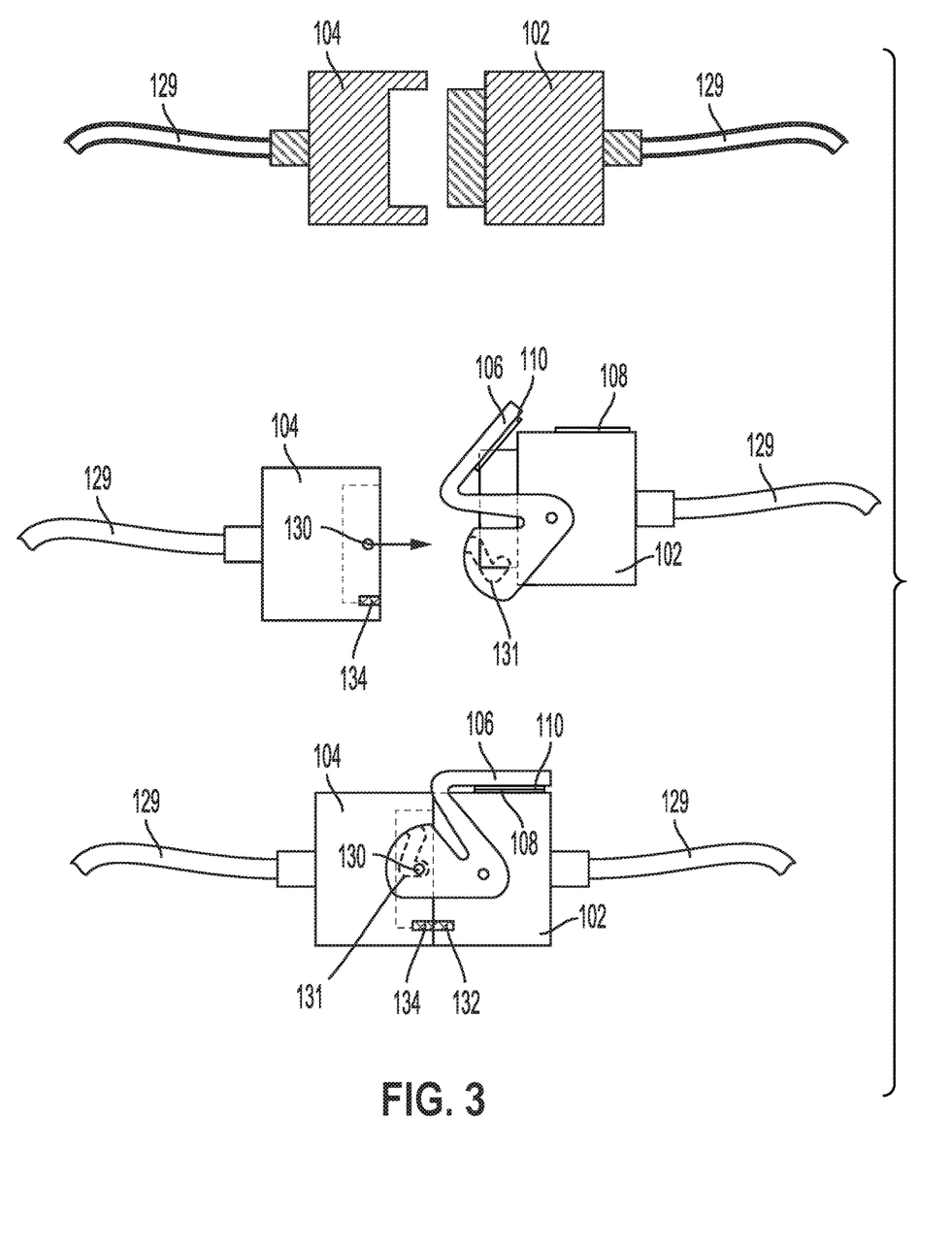
FIG. 3 depicts a cross-sectional view and two exterior side views of the example embodiment of the system of FIG. 1 shown in FIG. 2, according to an example implementation.

FIG. 3 depicts, from top to bottom, a cross-sectional side view of the first component 102 (depicted as a male electrical connector), the second component 104 (depicted as a female electrical connector), and the electrical cables 129, a first exterior side view of the first component 102, the second component 104, the connector 106 (depicted as the cam lever in an example of the first position), and the electrical cables 129, and a second exterior side view of the first component 102, the second component 104, the connector 106 (depicted as the cam lever in an example of the second position), and the electrical cables 129. In addition, FIG. 3 depicts, in the first and second exterior side views, the first circuit 108 and the second circuit 110. In line with the description above, the pin 130 is moved in the direction of the arrow shown in the first exterior side view and into the groove 131. Further, when the connector 106 is brought down such that the underside of the connector 106 having the second circuit 110 moves towards the top surface of the first connector 102 having the first circuit 108, the pin 130 reaches and stops at a back end of the groove 131, as shown in the second exterior side view, and an electrical connection occurs between the first circuit 108 and the second circuit 110.

Figure 4:
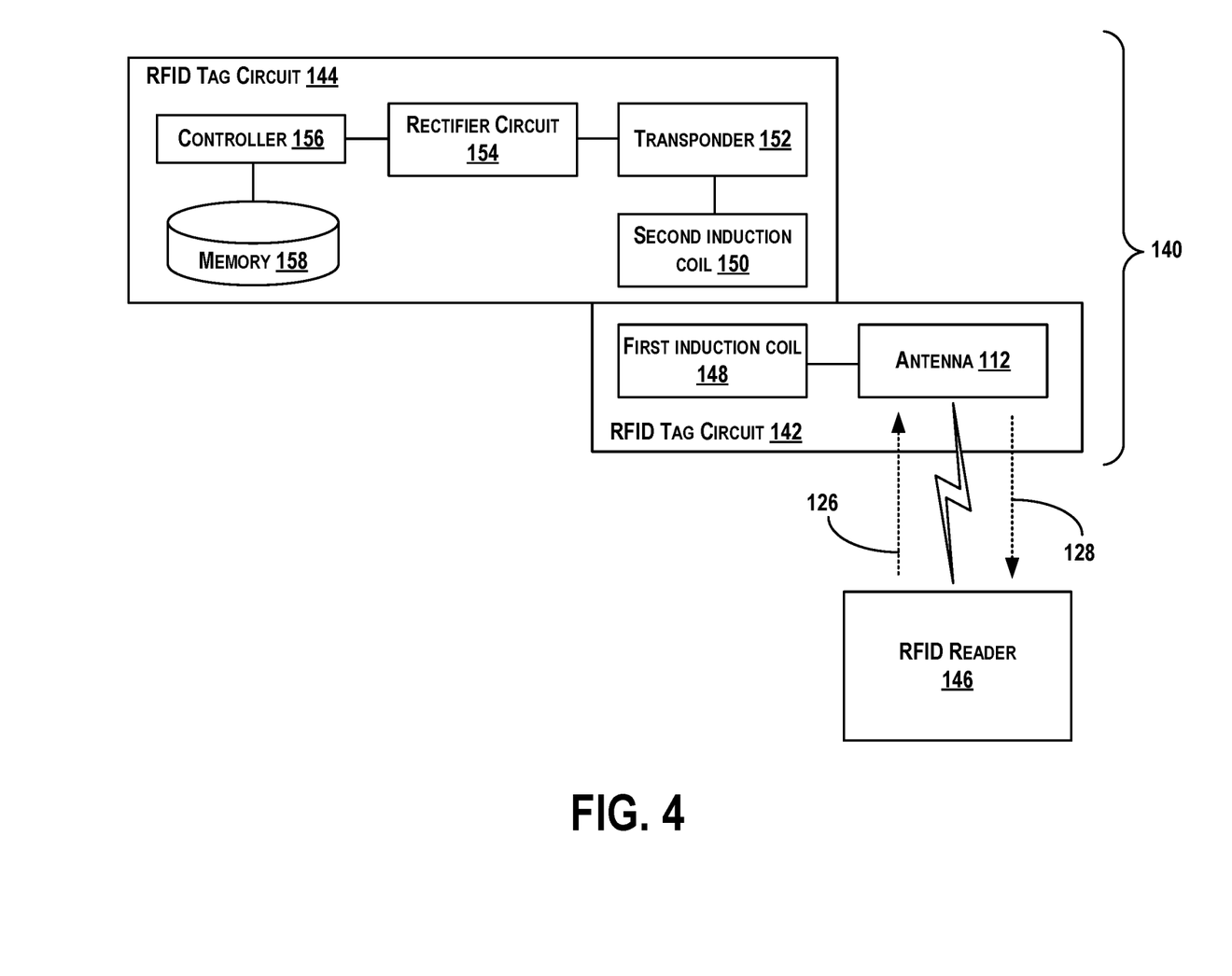
FIG. 4 depicts an example of the first circuit and the second circuit of the system of FIG. 1, according to an example implementation.

FIG. 4 depicts an example of the first circuit 108 and the second circuit 110 of the system 100. In particular, FIG. 4 is an example embodiment where an RFID tag 140 is split into two portions, where one portion includes the antenna 112, and the two portions are attached (e.g., adhered, such as if the RFID tag is in sticker form) to the first component (not shown) and the connector (not shown). Thus, in FIG. 4, the first circuit 108 is depicted as RFID tag circuit 142 and the second circuit 110 is depicted as RFID tag circuit 144. FIG. 4 also depicts an RFID reader 146 which is configured to transmit the first signal 126 to, and receive the response signal 128 from, the antenna 112. The processor 118 of FIG. 1 (not shown in FIG. 4) can be coupled to the RFID reader 146 and configured to detect alignment between the first component 102 and the second component 104 based on receipt of the response signal 128.

As shown, RFID tag circuit 142 includes a first induction coil 148 and the antenna 112. RFID tag circuit 144 includes a second induction coil 150, a transponder 152, a rectifier circuit 154, a controller 156, and a memory 158. As such, the electrical connection that occurs between the first circuit 108 and the second circuit 110 when the connector 106 is in the second positon can take the form of an inductive connection between the first induction coil 148 and the second induction coil 150. The transponder 152 can be configured to receive an incoming communication signal from the RFID reader 146, such as the first signal 126, and responsively emit a response signal, such as response signal 128, to be transmitted back to the RFID reader 146, where the response signal can include data not originally contained in the incoming communication signal. The rectifier circuit 154 can be configured to convert a portion of the incoming communication signal from the antenna 112 into power needed for the RFID tag circuit 142 and the RFID circuit 144 to operate. The controller 156 can take the form of a processor or other circuitry configured to receive or transmit data to/from the RFID reader 146 and further configured to manage information, such as an identifier of the RFID tag 140, between the RFID tag 140 and other computing devices such as a server or cloud computing device.

In some embodiments, the RFID reader 146 and the RFID tag 140 can be configured to transmit and receive signals having a first frequency that is different from a resonant frequency of one or more of the first circuit 108 and the second circuit 110, such as a resonant frequency of the first induction coil 148 and/or the second induction coil 150. The first frequency and the resonant frequency can be selected to be different such that they will not interfere with each other. For example, the RFID reader 146 can transmit signals in the 902-928 megahertz (MHz) band, and the first induction coil 148 and/or the second induction coil 150 can be operated at a resonant frequency in a range of 50 to 250 kilohertz (kHz). The induction coils and antenna resonating at different frequencies can helpfully prevent power from one of the induction coils going into the antenna, or vice versa.

In some embodiments, the memory 158 of the RFID tag 140 can store an identifier of the RFID tag 140 and the controller 156 can be configured to cause the antenna 112 to transmit, as part of the response signal 128 or as a separate signal, data representing the identifier to the RFID reader 146 and/or to the computing device 116 in response to receiving the first signal 126. Other information can be stored in the memory 158 and transmitted to the RFID reader 146 and/or to the computing device 116 as well.

Figure 5:
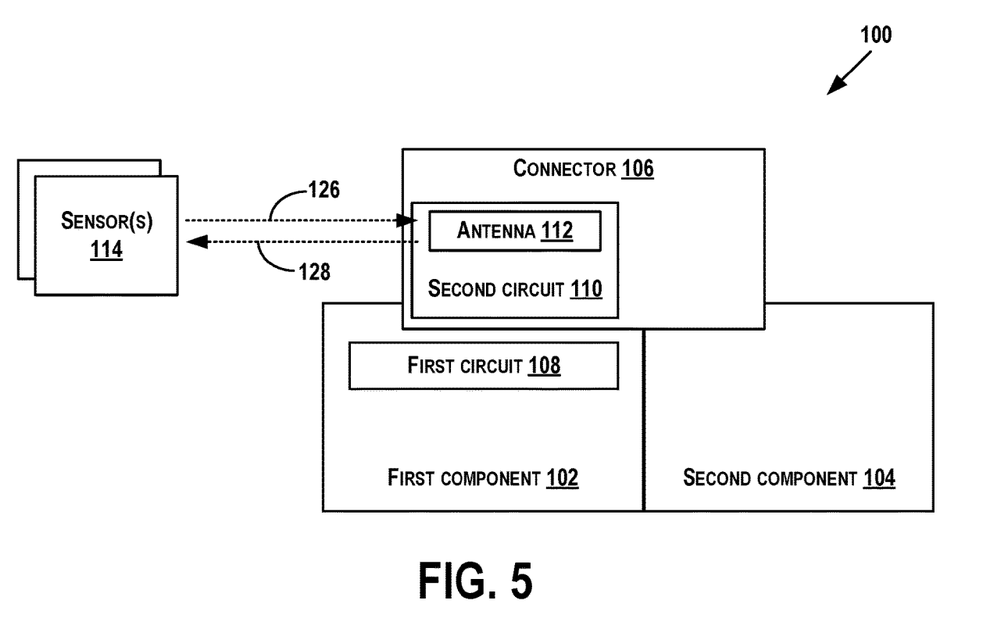
FIG. 5 depicts another example of the system of FIG. 1, according to an example implementation.

FIG. 5 depicts another example of the system 100, particularly where the second circuit 110 includes the antenna 112.

Figure 6:
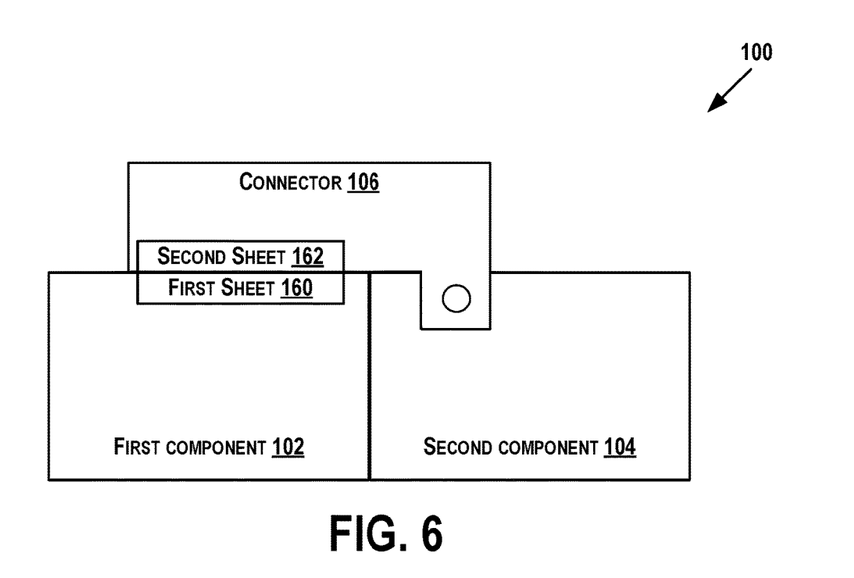
FIG. 6 depicts another example of the system of FIG. 1, according to an example implementation.

FIG. 6 depicts another example of the system 100, particularly where the first circuit 108 includes a first conductive sheet 160 and the second circuit 110 includes a second conductive sheet 162. In such an embodiments, the electrical connection between the first and second circuits can occur as a result of the physical contact between the first conductive sheet 160 and the second conductive sheet 162 when the connector 106 is moved to the second position, as shown in FIG. 6.

Figure 7:
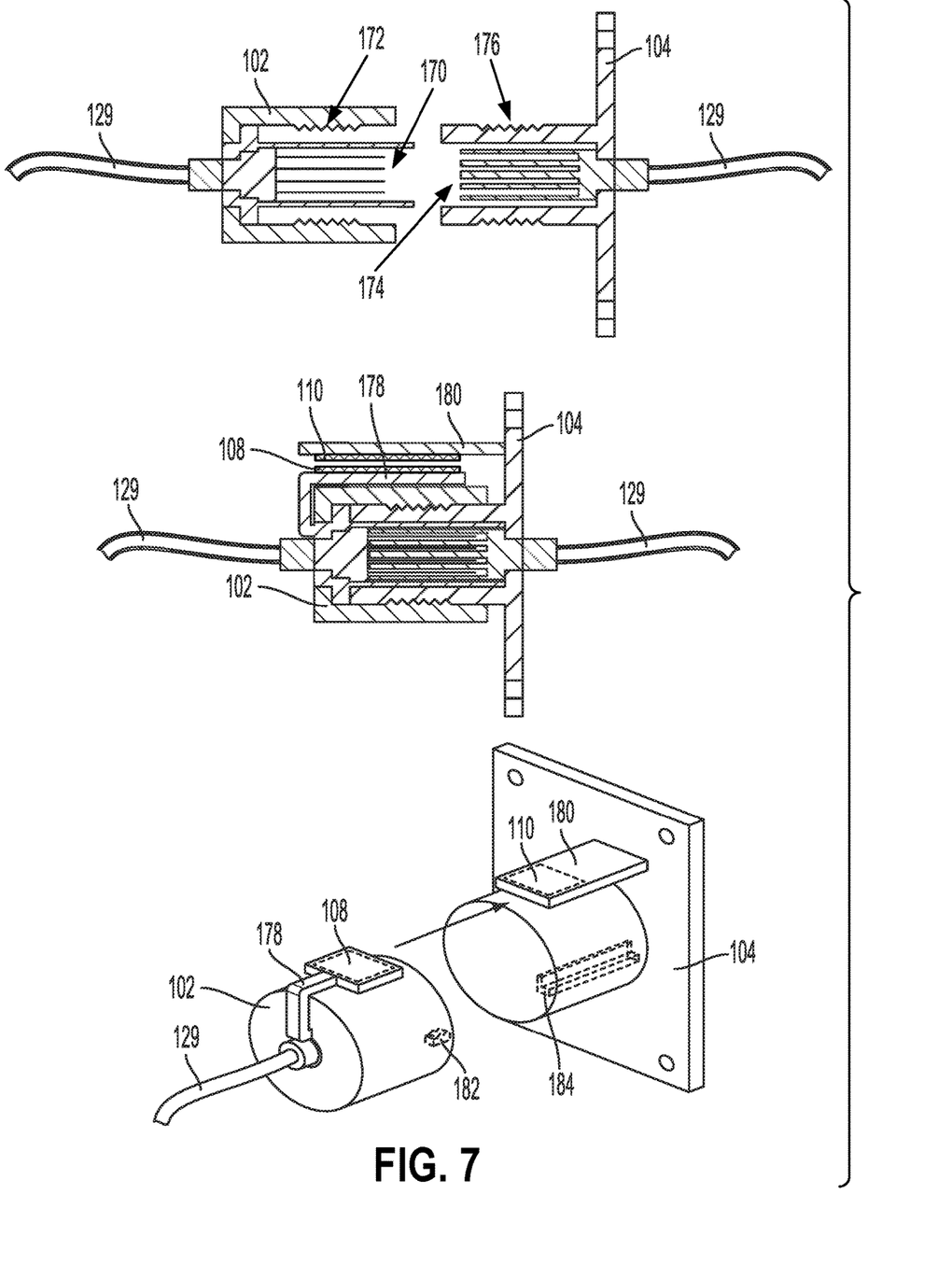
FIG. 7 depicts two cross-sectional side views and one perspective view of an alternative example of the system of FIG. 1, according to an example implementation.

FIG. 7 depicts an alternative example embodiment of the system 100 for indicating alignment between two components that are mechanically coupled to each other. In particular, the alternative embodiment shown in FIG. 7 includes variations in the mechanisms that enable the first component 102 and the second component 104 to mechanically couple to each other, and that enable the electrical connection between the first circuit 108 and the second circuit 110 to occur.

In the topmost cross-sectional side view, the first component 102 is depicted as a circular male electrical connector having pins 170 and first threads 172, and the second component 104 is depicted as a circular female electrical connector having sockets 174 and second threads 176. When connecting the first component 102 to the second component 104, the first component 102 can be twisted, thus advancing the first threads 172 over the second threads 176 and moving the pins 170 into the sockets 174.

In the cross-sectional side view below the topmost cross-sectional side view, the first component 102 is shown in a final position where the first component 102 cannot be advanced any farther over the second threads 176. In some cases, this final position can be considered a position of alignment similar to the "second position" referred to in other embodiments herein. To that point, a bent member 178 protrudes from the first component 102 and the first circuit 108 is affixed to a top surface of a distal end of the bent member 178. The first circuit 108 is substantially aligned with the second circuit 110, which is affixed to a bottom surface of a cantilever 180 that protrudes from a perpendicular surface of the second component 104. In the position shown in this view, the electrical connection can occur between the first circuit 108 and the second circuit 110.

In some embodiments, the first component 102 can include a rotating portion (e.g., having the first threads 172) and a non-rotating portion. In such embodiments, the non-rotating portion can include a key (e.g., a protrusion) configured to be inserted into and follow a guided key slot (e.g., a groove) disposed in a portion of the second component 104. Such a key/key slot arrangement can help ensure that the pins 170 go into the sockets 174 correctly and to maintain alignment of the first component 102 with the second component 104 (and thus maintain the positions of the first circuit 108 and the second circuit 110 to maintain the electrical connection). The perspective view shown at the bottom of FIG. 7 is a simplified depiction of a key 182 and a key slot 184 that can be used. For simplicity, the pins, sockets, threads, etc. are not shown. Other example embodiments are possible as well.

In an alternative example of the embodiment shown in FIG. 7, the first circuit 108 or the second circuit 110 could be affixed to a top surface of the first component 102. In such an example, the cantilever 180 can be positioned closer to where the top surface will be located once the first component 102 reaches the second/final position.

Figure 8:
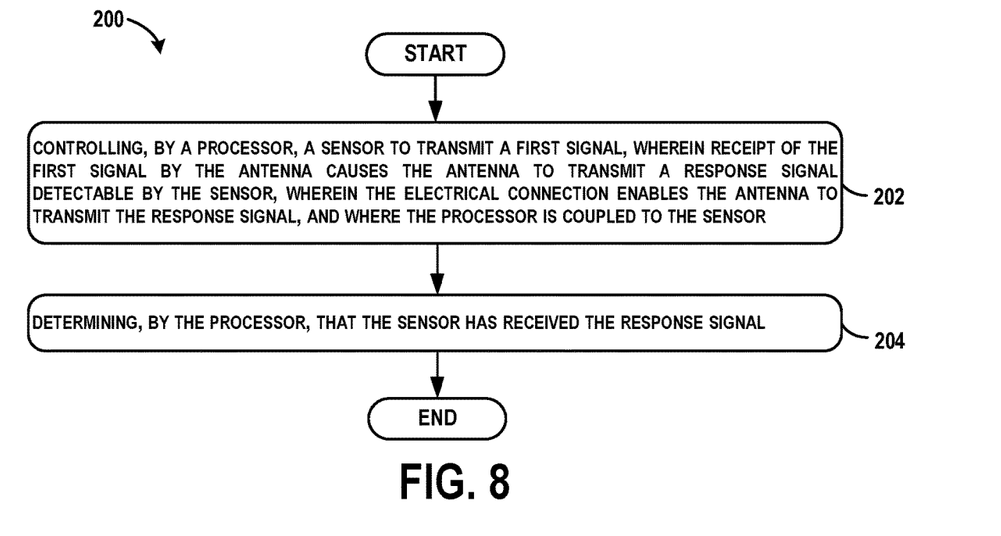
FIG. 8 shows a flowchart of an example method for detecting alignment between a first component and a second component that are mechanically coupled to each other, according to an example implementation.

FIG. 8 shows a flowchart of an example of a method 200 that could be used with the system 100 and components thereof shown in FIGS. 1, 2, 3, 4, 5, 6, and 7. Method 200 may include one or more operations, functions, or actions as illustrated by one or more of blocks 202-204. In particular, the method 200 is for detecting alignment between a first component and a second component that are mechanically coupled to each other. As described above with respect to the system 100 of FIG. 1, the first component and the second component are mechanically coupled to each other by moving a connector from a first position to a second position, a first circuit is affixed to the first component, and a second circuit is affixed to the connector. Further, the first circuit and the second circuit are positioned on the first component and the connector, respectively, such that an electrical connection between the first circuit and the second circuit occurs when the connector is in the second position and the first component and the second component are aligned. Still further, the first circuit or the second circuit include an antenna.

At block 202, the method 200 includes controlling, by a processor, a sensor to transmit a first signal, wherein receipt of the first signal by the antenna causes the antenna to transmit a response signal detectable by the sensor, wherein the electrical connection enables the antenna to transmit the response signal, and wherein the processor is coupled to the sensor. The processor can take the form of processor 118 or a processor/chip of the sensor.

At block 204, the method 200 includes determining, by the processor, that the sensor has received the response signal.

Figure 9:
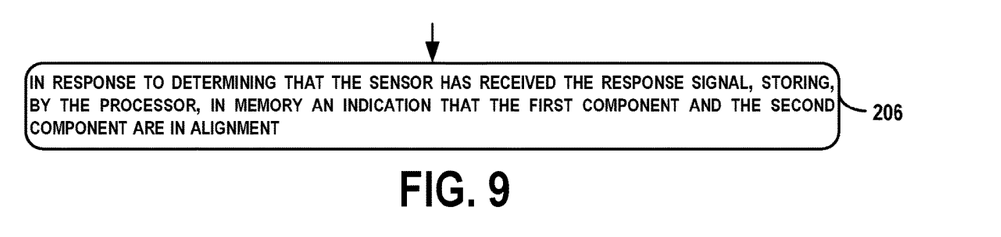
FIG. 9 shows a flowchart of an example method for use with the method of FIG. 8, according to an example implementation.

FIG. 9 shows a flowchart of an example method for use with the method 200. At block 206, functions include in response to determining that the sensor has received the response signal, storing, by the processor, in memory an indication that the first component and the second component are in alignment.

Figure 10:
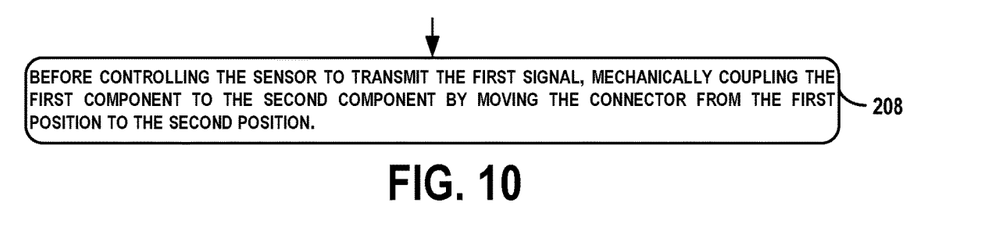
FIG. 10 shows a flowchart of another example method for use with the method of FIG. 8, according to an example implementation.

FIG. 10 shows a flowchart of an example method for use with the method 200. At block 208, functions include before controlling the sensor to transmit the first signal, mechanically coupling the first component to the second component by moving the connector from the first position to the second position.

Figure 11:
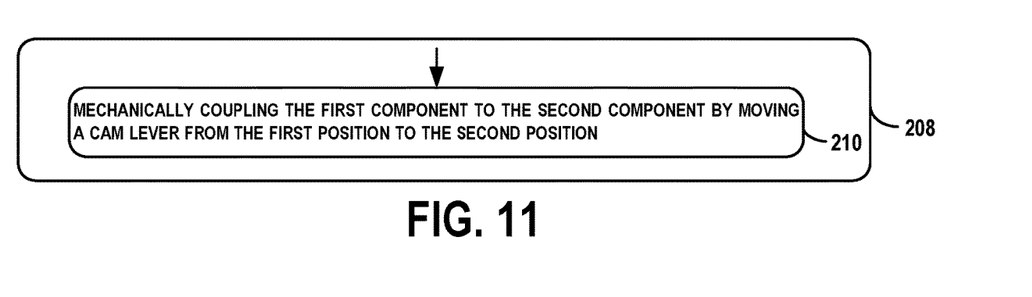
FIG. 11 shows a flowchart of an example method for performing the mechanically coupling function of the method of FIG. 10, according to an example implementation.

FIG. 11 shows a flowchart of an example method for performing the mechanically coupling as shown in block 208. At block 210, functions include mechanically coupling the first component to the second component by moving a cam lever from the first position to the second position.

Figure 12:
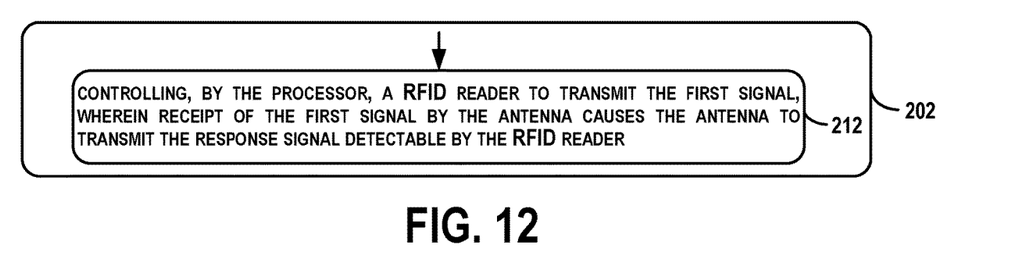
FIG. 12 shows a flowchart of an example method for performing the controlling function of the method of FIG. 8, according to an example implementation.

FIG. 12 shows a flowchart of an example method for performing the controlling as shown in block 202. In particular, the example method of FIG. 12 can be performed in an embodiment where the first circuit includes a first induction coil and is a first portion of a radio frequency identification (RFID) tag, where the second circuit includes a second induction coil and is a second portion of the RFID tag, and where the electrical connection is an inductive connection between the first induction coil and the second induction coil. At block 212, functions include controlling, by the processor, a RFID reader to transmit the first signal, wherein receipt of the first signal by the antenna causes the antenna to transmit the response signal detectable by the RFID reader.

Figure 13:
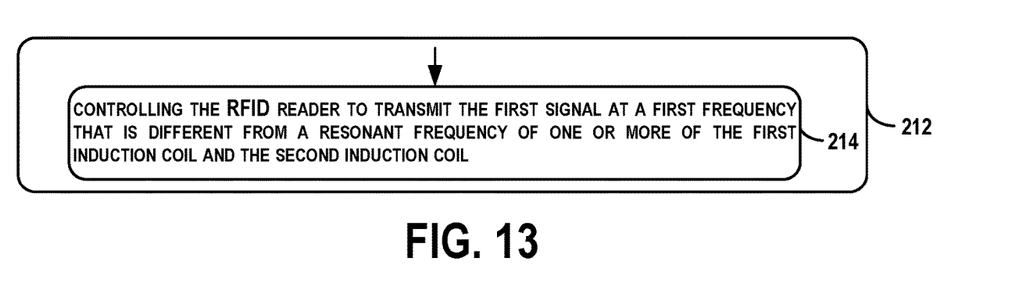
FIG. 13 shows a flowchart of an example method for performing the controlling function of the method of FIG. 12, according to an example implementation.

FIG. 13 shows a flowchart of an example method for performing the controlling as shown in block 212. At block 214, functions include controlling the RFID reader to transmit the first signal at a first frequency that is different from a resonant frequency of one or more of the first induction coil and the second induction coil. In some embodiments, the first frequency and the resonant frequency are selected to not interfere with each other.

Figure 14:
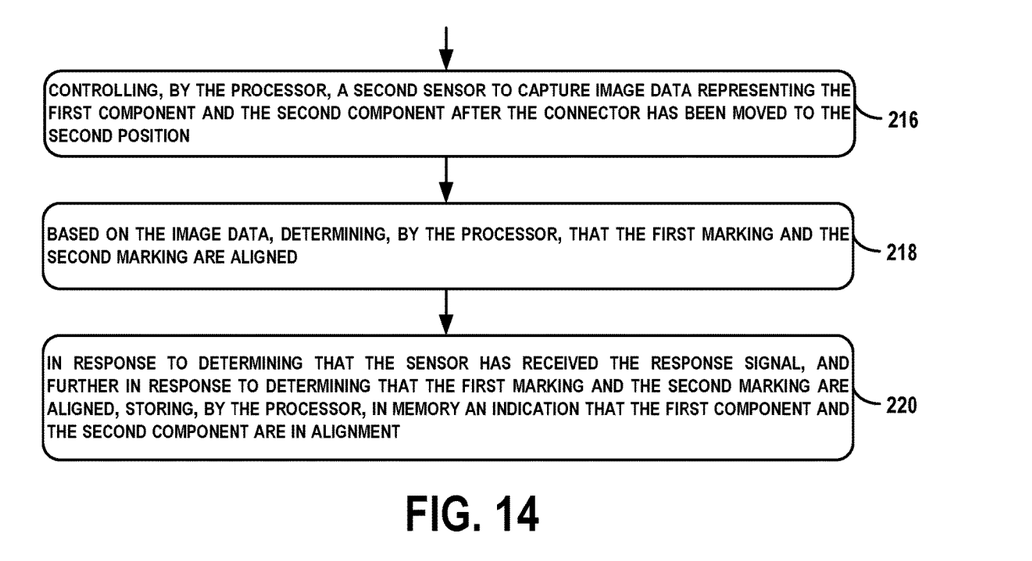
FIG. 14 shows a flowchart of another example method for use with the method of FIG. 8, according to an example implementation.

FIG. 14 shows a flowchart of an example method for use with the method 200. In particular, the example method of FIG. 14 can be performed in an embodiment where the first component includes a first marking configured to visually indicate alignment between the first component and the second component, and where the second component includes a second marking configured to visually indicate alignment between the first component and the second component. At block 216, functions include controlling, by the processor, a second sensor to capture image data representing the first component and the second component after the connector has been moved to the second position. And at block 218, functions include based on the image data, determining, by the processor, that the first marking and the second marking are aligned. And at block 220, functions include in response to determining that the sensor has received the response signal, and further in response to determining that the first marking and the second marking are aligned, storing, by the processor, in memory an indication that the first component and the second component are in alignment.

Devices or systems may be used or configured to perform logical functions presented in FIGS. 8, 9, 10, 11, 12, 13, and 14. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner. Although blocks in FIGS. 8, 9, 10, 11, 12, 13, and 14, are illustrated in a sequential order, these blocks may also be performed in parallel, and/or in a different order than those described herein. Also, the various blocks may be combined into fewer blocks, divided into additional blocks, and/or removed based upon the desired implementation.

It should be understood that for these and other processes and methods disclosed herein, flowcharts show functionality and operation of one possible implementation of present examples. In this regard, each block or portions of each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. Further, the program code can be encoded on a computer-readable storage media in a machine-readable format, or on other non-transitory media or articles of manufacture. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block or portions of each block in FIGS. 8, 9, 10, 11, 12, 13, and 14 may represent circuitry that is wired to perform the specific logical functions in the process. Alternative implementations are included within the scope of the examples of the present disclosure in which functions may be executed out of order from that shown or discussed, including substantially concurrent or in reverse order, depending on the functionality involved, as would be understood by those reasonably skilled in the art.

Different examples of the system(s), device(s), and method(s) disclosed herein include a variety of components, features, and functionalities. It should be understood that the various examples of the system(s), device(s), and method(s) disclosed herein may include any of the components, features, and functionalities of any of the other examples of the system(s), device(s), and method(s) disclosed herein in any combination or any sub-combination, and all of such possibilities are intended to be within the scope of the disclosure.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A system for indicating alignment between two components that are mechanically coupled to each other, the system comprising:
   a first component;
   a second component;
   a connector configured to mechanically couple the first component to the second component by moving the connector from a first position to a second position, wherein the connector comprises a cam lever;
   a first circuit affixed to an outer surface of the first component; and
   a second circuit affixed to an underside of the cam lever, wherein the first circuit and the second circuit are positioned on the first component and the connector, respectively, such that based on the connector being in the second position and the first component and the second component being aligned, the first circuit affixed to the outer surface faces towards the underside of the cam lever and an electrical connection between the first circuit and the second circuit occurs,
   wherein the first circuit or the second circuit comprises an antenna,
   wherein the electrical connection enables the antenna to transmit a signal,
   wherein the second component comprises a pin protruding from a side surface of the second component,
   wherein the cam lever comprises a groove configured to receive the pin based on mechanical coupling of the first component to the second component, and
   wherein based on the cam lever being moved from the first position to the second position, the pin moves through the grooves toward a back end of the groove.

2. The system of claim 1, further comprising:
   a sensor configured to receive the signal from the antenna; and
   a processor coupled to the sensor and configured to detect alignment between the first component and the second component based on receipt of the signal.

3. The system of claim 1, wherein the first circuit is a first portion of a radio frequency identification (RFID) tag, and wherein the second circuit is a second portion of the RFID tag.

4. The system of claim 3, further comprising:
   a RFID reader configured to receive the signal from the RFID tag; and a processor coupled to the RFID reader and configured to detect alignment between the first component and the second component based on receipt of the signal.

5. The system of claim 4, wherein the RFID reader and the RFID tag are configured to transmit and receive signals having a first frequency that is different from a resonant frequency of one or more of the first circuit and the second circuit, and wherein the first frequency and the resonant frequency are selected to not interfere with each other.

6. The system of claim 1, wherein the first circuit comprises a first induction coil, wherein the second circuit comprises a second induction coil, and wherein the electrical connection is an inductive connection between the first induction coil and the second induction coil.

7. The system of claim 1, wherein the first circuit comprises a first conductive sheet, wherein the second circuit comprises a second conductive sheet, and wherein the electrical connection includes physical contact between the first conductive sheet and the second conductive sheet.

8. The system of claim 1, wherein the first circuit comprises the antenna.

9. The system of claim 1, wherein the second circuit comprises the antenna.

10. The system of claim 1, wherein the first component comprises a first marking configured to visually indicate alignment between the first component and the second component, wherein the second component comprises a second marking configured to visually indicate alignment between the first component and the second component, and wherein the first marking and the second marking are aligned based on the connector being in the second position and the first component and the second component being aligned.

11. A method for detecting alignment between a first component and a second component that are mechanically coupled to each other, wherein the first component and the second component are mechanically coupled to each other by moving a connector from a first position to a second position, wherein the connector comprises a cam lever, wherein a first circuit is affixed to an outer surface of the first component, wherein a second circuit is affixed to an underside of the cam lever, wherein the first circuit and the second circuit are positioned on the first component and the connector, respectively, such that based on the connector being in the second position and the first component and the second component being aligned, the first circuit affixed to the outer surface faces towards the underside of the cam lever and an electrical connection between the first circuit and the second circuit occurs, wherein the first circuit or the second circuit comprises an antenna, wherein the second component comprises a pin protruding from a side surface of the second component, wherein the cam lever comprises a groove configured to receive the pin based on mechanical coupling of the first component to the second component, and wherein based on the cam lever being moved from the first position to the second position, the pin moves through the groove toward a back end of the groove, the method comprising:

controlling, by a processor, a sensor to transmit a first signal, wherein receipt of the first signal by the antenna causes the antenna to transmit a response signal detectable by the sensor, wherein the electrical connection enables the antenna to transmit the response signal, and wherein the processor is coupled to the sensor; and determining, by the processor, that the sensor has received the response signal.

12. The method of claim 11, further comprising:

in response to determining that the sensor has received the response signal, storing, by the processor, in memory an indication that the first component and the second component are in alignment.

13. The method of claim 11, further comprising:

before controlling the sensor to transmit the first signal, mechanically coupling the first component to the second component by moving the connector from the first position to the second position.

14. The method of claim 11, wherein the first circuit comprises a first induction coil and is a first portion of a radio frequency identification (RFID) tag, wherein the second circuit comprises a second induction coil and is a second portion of the RFID tag, wherein the electrical connection is an inductive connection between the first induction coil and the second induction coil, and wherein controlling, by the processor, the sensor to transmit the first signal comprises controlling, by the processor, a RFID reader to transmit the first signal, wherein receipt of the first signal by the antenna causes the antenna to transmit the response signal detectable by the RFID reader.

15. The method of claim 14, wherein controlling the RFID reader to transmit the first signal comprises controlling the RFID reader to transmit the first signal at a first frequency that is different from a resonant frequency of one or more of the first induction coil and the second induction coil, and wherein the first frequency and the resonant frequency are selected to not interfere with each other.

16. The method of claim 11, wherein the first component comprises a first marking configured to visually indicate alignment between the first component and the second component, and wherein the second component comprises a second marking configured to visually indicate alignment between the first component and the second component, the method further comprising:

controlling, by the processor, a second sensor to capture image data representing the first component and the second component after the connector has been moved to the second position; and based on the image data, determining, by the processor, that the first marking and the second marking are aligned; and in response to determining that the sensor has received the response signal, and further in response to determining that the first marking and the second marking are aligned, storing, by the processor, in memory an indication that the first component and the second component are in alignment.

17. A non-transitory computer readable medium having stored thereon instructions, that when executed by one or more processors of a computing device, cause the computing device to perform operations comprising:

controlling a sensor to transmit a first signal, wherein receipt of the first signal by an antenna causes the antenna to transmit a response signal detectable by the sensor, wherein an electrical connection between a first circuit affixed to an outer surface of a first component and a second circuit affixed to a connector enables the antenna to transmit the response signal, wherein the connector comprises a cam lever, wherein the second circuit is affixed to an underside of the cam lever, wherein the connector, based on the connector being moved from a first position to a second position, mechanically couples the first component to a second component, wherein the first circuit and the second circuit are positioned on the first component and the connector, respectively, such that based on the connector being in the second position and the first component and the second component being aligned, the first circuit affixed to the outer surface faces towards the underside of the cam lever and the electrical connection between the first circuit and the second circuit occurs, wherein the second component comprises a pin protruding from a side surface of the second component, wherein the cam lever comprises a groove configured to receive the pin based on mechanical coupling of the first component to the second component, and wherein based on the cam lever being moved from the first position to the second position, the pin moves through the groove toward a back end of the groove; and determining that the sensor has received the response signal.

18. The non-transitory computer readable medium of claim 17, the operations further comprising:

in response to determining that the sensor has received the response signal, storing in memory an indication that the first component and the second component are in alignment.

19. The method of claim 13, wherein mechanically coupling the first component to the second component by moving the connector from the first position to the second position comprises moving the cam lever from the first position to the second position such that the pin moves through the groove toward back end of the groove.

20. The system of claim 1, wherein based on the connector being in the second position, the outer surface of the first component is positioned parallel to the underside of the cam lever.

* * * * *